United States Patent
Lou et al.

(10) Patent No.: US 8,217,478 B2
(45) Date of Patent: Jul. 10, 2012

(54) MAGNETIC STACK WITH OXIDE TO REDUCE SWITCHING CURRENT

(75) Inventors: Xiaohua Lou, Bloomington, MN (US); Yuankai Zheng, Bloomington, MN (US); Wenzhong Zhu, Apple Valley, MN (US); Wei Tian, Bloomington, MN (US); Zheng Gao, San Jose, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 152 days.

(21) Appl. No.: 12/425,466

(22) Filed: Apr. 17, 2009

(65) Prior Publication Data

US 2010/0090301 A1   Apr. 15, 2010

Related U.S. Application Data

(60) Provisional application No. 61/104,400, filed on Oct. 10, 2008.

(51) Int. Cl.
*H01L 29/82* (2006.01)
*G11C 11/02* (2006.01)

(52) U.S. Cl. ........ 257/421; 257/422; 257/423; 257/424; 257/E29.323; 438/3; 365/157; 365/158; 360/324.2

(58) Field of Classification Search .......... 257/20, 257/414, 421–427, E29.323; 438/3; 360/324–326, 360/313; 365/157–158, 171–173
See application file for complete search history.

(56) References Cited

U.S. PATENT DOCUMENTS

| | | | |
|---|---|---|---|
| 5,461,526 | A | 10/1995 | Hamakawa |
| 5,841,692 | A | 11/1998 | Gallagher |
| 5,963,472 | A | 10/1999 | Inada |
| 6,146,775 | A | 11/2000 | Fujita |
| 6,166,948 | A | 12/2000 | Parkin |
| 6,183,859 | B1 | 2/2001 | Chen |
| 6,522,573 | B2 | 2/2003 | Saito |
| 6,597,618 | B2 | 7/2003 | Zheng |
| 6,605,772 | B2 | 8/2003 | Harman |
| 6,633,498 | B1 | 10/2003 | Engel |
| 6,714,444 | B2 | 3/2004 | Huai |
| 6,771,534 | B2 | 8/2004 | Stipe |

(Continued)

FOREIGN PATENT DOCUMENTS

WO   WO 2008/154519   12/2008

OTHER PUBLICATIONS

Ozatay et al., "Sidewall oxide effects on spin-torque- and magnetic-field-induced reversal characteristics of thin-film nanomagnets", Nature Materials, vol. 7, pp. 567-573 (Jul. 2008).

(Continued)

*Primary Examiner* — Jami M Valentine
(74) *Attorney, Agent, or Firm* — Mueting Raasch & Gebhardt PA

(57) ABSTRACT

A magnetic stack having a ferromagnetic free layer, a metal oxide layer that is antiferromagnetic at a first temperature and non-magnetic at a second temperature higher than the first temperature, a ferromagnetic pinned reference layer, and a non-magnetic spacer layer between the free layer and the reference layer. During a writing process, the metal oxide layer is non-magnetic. For magnetic memory cells, such as magnetic tunnel junction cells, the metal oxide layer provides reduced switching currents.

20 Claims, 3 Drawing Sheets

U.S. PATENT DOCUMENTS

| | | |
|---|---|---|
| 6,781,874 B2 | 8/2004 | Hidaka |
| 6,791,865 B2 | 9/2004 | Tran |
| 6,819,586 B1 | 11/2004 | Anthony |
| 6,829,161 B2 | 12/2004 | Huai |
| 6,838,740 B2 | 1/2005 | Huai |
| 6,845,038 B1 | 1/2005 | Shukh |
| 6,847,547 B2 | 1/2005 | Albert |
| 6,888,742 B1 | 5/2005 | Nguyen |
| 6,903,400 B2 | 6/2005 | Kikuchi |
| 6,933,155 B2 | 8/2005 | Albert |
| 6,950,335 B2 | 9/2005 | Dieny |
| 6,958,927 B1 | 10/2005 | Nguyen |
| 6,963,098 B2 | 11/2005 | Daughton et al. |
| 6,967,863 B2 | 11/2005 | Huai |
| 6,980,464 B2 | 12/2005 | Fukuzumi |
| 6,980,469 B2 | 12/2005 | Kent |
| 6,985,385 B2 | 1/2006 | Nguyen |
| 6,992,359 B2 | 1/2006 | Nguyen |
| 7,006,336 B2 | 2/2006 | Coffey |
| 7,020,009 B2 | 3/2006 | Ho |
| 7,031,178 B2 | 4/2006 | Parkin |
| 7,057,921 B2 | 6/2006 | Valet |
| 7,088,609 B2 | 8/2006 | Valet |
| 7,098,494 B2 | 8/2006 | Pakala |
| 7,110,287 B2 | 9/2006 | Huai et al. |
| 7,126,202 B2 | 10/2006 | Huai |
| 7,160,770 B2 | 1/2007 | Susaki |
| 7,161,829 B2 | 1/2007 | Huai |
| 7,170,778 B2 | 1/2007 | Kent |
| 7,180,113 B2 | 2/2007 | Braun |
| 7,180,770 B2 | 2/2007 | Perner |
| 7,187,577 B1 | 3/2007 | Wang |
| 7,190,611 B2 | 3/2007 | Nguyen |
| 7,205,564 B2 | 4/2007 | Kajiyama |
| 7,224,601 B2 | 5/2007 | Panchula |
| 7,227,773 B1 | 6/2007 | Nguyen |
| 7,230,265 B2 | 6/2007 | Kaiser |
| 7,230,845 B1 | 6/2007 | Wang |
| 7,233,039 B2 | 6/2007 | Huai |
| 7,241,631 B2 | 7/2007 | Huai |
| 7,242,045 B2 | 7/2007 | Nguyen |
| 7,242,048 B2 | 7/2007 | Huai |
| 7,245,462 B2 | 7/2007 | Huai |
| 7,252,852 B1 | 8/2007 | Parkin |
| 7,272,034 B1 | 9/2007 | Chen |
| 7,272,035 B1 | 9/2007 | Chen |
| 7,274,057 B2 | 9/2007 | Worledge |
| 7,282,755 B2 | 10/2007 | Pakala |
| 7,286,395 B2 | 10/2007 | Chen |
| 7,289,356 B2 | 10/2007 | Diao |
| 7,307,876 B2 | 12/2007 | Kent |
| 7,310,265 B2 | 12/2007 | Zheng |
| 7,339,817 B2 | 3/2008 | Nickel |
| 7,342,169 B2 | 3/2008 | Venkatasubramanian |
| 7,345,911 B2 | 3/2008 | Min |
| 7,345,912 B2 | 3/2008 | Luo |
| 7,349,243 B2 | 3/2008 | Lin |
| 7,369,427 B2 | 5/2008 | Diao |
| 7,372,116 B2 | 5/2008 | Fullerton |
| 7,379,280 B2 | 5/2008 | Fukumoto |
| 7,379,327 B2 | 5/2008 | Chen |
| 7,411,817 B2 | 8/2008 | Nozieres |
| 7,430,135 B2 | 9/2008 | Huai |
| 7,453,720 B2 | 11/2008 | Ju |
| 7,479,193 B1 | 1/2009 | Clark |
| 7,486,545 B2 | 2/2009 | Min |
| 7,486,551 B1 | 2/2009 | Li |
| 7,486,552 B2 | 2/2009 | Apalkov |
| 7,489,541 B2 | 2/2009 | Pakala |
| 7,502,249 B1 | 3/2009 | Ding |
| 7,508,702 B2 | 3/2009 | Ho |
| 7,515,457 B2 | 4/2009 | Chen |
| 7,518,835 B2 | 4/2009 | Huai |
| 7,525,862 B1 | 4/2009 | Sun |
| 7,576,956 B2 | 8/2009 | Huai |
| 7,660,151 B2 | 2/2010 | Leuscher |
| 7,800,095 B2 | 9/2010 | An |
| 7,804,709 B2 | 9/2010 | Wang |
| 2002/0186582 A1 | 12/2002 | Sharma |
| 2003/0146456 A1 | 8/2003 | Hanson et al. |
| 2004/0084702 A1 | 5/2004 | Jeong |
| 2004/0165320 A1* | 8/2004 | Carey et al. ............. 360/324.11 |
| 2005/0018475 A1 | 1/2005 | Tran |
| 2005/0104146 A1 | 5/2005 | Nickel |
| 2005/0150535 A1 | 7/2005 | Samavedam |
| 2005/0150537 A1 | 7/2005 | Ghoshal |
| 2006/0102969 A1 | 5/2006 | Huai |
| 2006/0215444 A1 | 9/2006 | Perner |
| 2007/0034919 A1 | 2/2007 | Wang |
| 2007/0063236 A1 | 3/2007 | Huai |
| 2007/0085068 A1 | 4/2007 | Apalkov |
| 2007/0176251 A1 | 8/2007 | Oh |
| 2007/0258281 A1 | 11/2007 | Ifo |
| 2008/0019040 A1 | 1/2008 | Zhu |
| 2008/0037179 A1 | 2/2008 | Info |
| 2008/0055792 A1 | 3/2008 | Zheng |
| 2008/0112094 A1 | 5/2008 | Kent |
| 2008/0137224 A1 | 6/2008 | Gao |
| 2008/0154519 A1 | 6/2008 | Zhou |
| 2008/0180827 A1 | 7/2008 | Zhu |
| 2008/0186758 A1* | 8/2008 | Shen et al. .................... 365/158 |
| 2008/0225584 A1 | 9/2008 | Gao |
| 2008/0273380 A1 | 11/2008 | Diao |
| 2008/0291720 A1 | 11/2008 | Wang |
| 2008/0291721 A1 | 11/2008 | Apalkov |
| 2008/0310213 A1 | 12/2008 | Chen |
| 2008/0310219 A1 | 12/2008 | Chen |
| 2009/0010040 A1 | 1/2009 | Takase |
| 2009/0040855 A1 | 2/2009 | Luo |
| 2009/0050991 A1 | 2/2009 | Nagai |
| 2009/0073750 A1 | 3/2009 | Leuschner |
| 2009/0185410 A1 | 7/2009 | Huai |
| 2009/0302403 A1 | 12/2009 | Nguyen |
| 2010/0034008 A1 | 2/2010 | Wang |
| 2010/0091564 A1* | 4/2010 | Gao et al. ...................... 365/171 |

OTHER PUBLICATIONS

Prejbeanu et al., "Thermally Assisted MRAM", J. Phys. Condens. Matter 19 (2007) 165218 (23 pp).

U.S. Appl. No. 12/239,807, filed Sep. 29, 2008, Inventors: Zheng et al.

U.S. Appl. No. 12/242,254, filed Sep. 30, 2008, Inventors: Zheng et al.

U.S. Appl. No. 12/248,237, filed Oct. 9, 2008, Inventor: Zhu.

U.S. Appl. No. 12/425,457, filed Apr. 17, 2009, Inventors: Gao et al.

Berger, L., Emission of Spin waves by a magnetic multilayer traversed by a current, Physical Review B, 1, Oct. 1996, pp. 9353-9358, vol. 54, No. 13, The American Physical Society, USA.

Florez, S.H. et al., Modification of Critical Spin Torque Current Induced by rf Excitation, Journal of Applied Physics, 103, 07a708 (2008).

Han et al., Current-Induced Butterfly Shaped Domains and Magnetization Switching in Magnetic Tunnel Junctions, Science and Technology of Advanced Materials 6 (2005) 784-788.

Hosomi et al., A Novel Nonvolatile Memory with Spin Torque Transfer Magnetization Switching: Spin-RAM, 2005 IEEE.

Johnson, M.T., et al., Magnetic anisotropy in metallic multilayers, Rep. Prog. Phys., 1996, pp. 1409-1458, vol. 59, IOP Publishing Ltd., UK.

Kawahara et al., 2Mb Spin-Transfer Torque RAM (SPRAM) with Bit-by-bit Bidirectional Current Write and Parallelizing Direction Current Read, ISSC 2007/Session 26/Non-Volatile Memories/26.5.

Kim, Chris H., et al. Dynamic Vt SRAM: A Leakage Tolerant Cache Memory for Low Voltage Microprocessors, ISLPED '02, Aug. 2002, pp. 251-254, US.

Meng et al., Spin Transfer in Nanomagnetic Devices with Perpendicular Anistropy, Applied Physics Letters 88, 172506 (2006).

Rivkin, K. et al., Magnetization Reversal in the Anisotropy-Dominated Regine Using Time-Dependent Magnetic Fileds, Applied Physics Letters 89, 252507 (2006).

Seki et al., Spin-Polarized Current-Induced Magnetization Reversal in Perpendicularly Magnetized L1o-FePt Layers, Applied Physics Letters 88, 172504 (2006).

Slonczewski et al., Conductance and Exchange Coupling of Two Ferromagnets Separated by a Tunneling Barrier, 1989 the American Physical Society, Physical Review B, vol. 39, No. 10, Apr. 1, 1989.

Slonczewski et al., Current-Driven Excitation of Magnetic Multilayers, Journal of Magnetism and Magnetic Materials 159 (1996) L1-L7.

Sun, Spin-Current Interaction with Monodomain Magnetic Body: A Model Study, Physical Review B, vol. 62, No. 1, Jul. 2000.

Thiele et al., FeRh//FePt Exchange Spring Films for Thermally Assisted Magnetic Recording Media, Applied Physics Letters, vol. 82, No. 17, Apr. 2003, p. 2859-2861.

Thiele et al., "Magnetic and Structural Properties of FePt-FeRh Exchange Spring Films for Thermally Assisted Magnetic Recording Media", IEEE Trans. Magnetics, vol. 40, Jul. 2004, p. 2537-2542.

Thiele et al., Spin Dynamics of the Anitferromagnetic-to-Ferromagnetic Phase Transition in FeRh on a Sub-Picosecind Time Scale, Applied Physics Letters, vol. 85, No. 14, Oct. 2004, p. 2857-2859.

Yagami, Kojiro, et al., Inspection of Intrinsic Critical Currents for Spin-Transfer Magnetization Switching, IEEE Transactions on Magnetics, Oct. 2005, pp. 2615-2617, vol. 41, No. 10.

Zhang, L., et al., Heat-assisted magnetic probe recording on a granular CoNi/Pt multilayered film, Journal of Physics D: Applied Physics, 2006, pp. 2485-2487, vol. 39, IOP Publishing Ltd., UK.

U.S. Appl. No. 12/106,363, filed Apr. 21, 2008, Inventors: Xi et al.
U.S. Appl. No. 12/125,975, filed May 23, 2008, Inventors: Xi et al.
U.S. Appl. No. 12/389,422, filed Feb. 20, 2009, Inventors: Ahn et al.
U.S. Appl. No. 12/396,868, filed Mar. 3, 2009; Inventors: Zheng.
U.S. Appl. No. 12/425,466, filed Apr. 17, 2009, Inventors: Lou et al.

Zheng, et al., Multilevel Magnetic Resistive Random Access Memory Written at Curie Point, Intermag Europe 2002, BB-02.

Zheng, Y. et al., Magnetic Random Access Memory (MRAM), J. Nano. Sci. Nano Tec. 7, 177-137 (2007).

C. Kittel, Ferromagnetism and Antiferromagnetism, Introduction to Solid State Physics, $5^{th}$ Edition, pp. 479-482.

Wikepedia, Neel Temperature; http://en.wikipedia.org/wik/Neel_temperature.

Wikepedia, Antiferromagnetism; http://en.wikipedia.org/wik/Antiferromagnetism.

* cited by examiner

MAGNETIC STACK WITH OXIDE TO REDUCE SWITCHING CURRENT

RELATED APPLICATION

This application claims priority to U.S. provisional patent application No. 61/104,400, filed on Oct. 10, 2008 and titled "ST-RAM Switching Current Reduction Using Free Layer Oxidation". The entire disclosure of application No. 61/104,400 is incorporated herein by reference.

BACKGROUND

Fast growth of the pervasive computing and handheld/communication industry has generated exploding demand for high capacity nonvolatile solid-state data storage devices and rotating magnetic data storage devices. Current technology like flash memory has several drawbacks such as slow access speed, limited endurance, and the integration difficulty. Flash memory (NAND or NOR) also faces scaling problems. Also, traditional rotating storage faces challenges in increasing areal density and in making components like reading/recording heads smaller and more reliable.

Resistive sense memories are promising candidates for future nonvolatile and universal memory by storing data bits as either a high or low resistance state. One such memory, magnetic random access memory (MRAM), features non-volatility, fast writing/reading speed, almost unlimited programming endurance and zero standby power. The basic component of MRAM is a magnetic tunneling junction (MTJ). MRAM switches the MTJ resistance by using a current induced magnetic field to switch the magnetization of MTJ. As the MTJ size shrinks, the switching magnetic field amplitude increases and the switching variation becomes more severe.

However, many yield-limiting factors must be overcome before such magnetic stacks can reliable be used as memory devices or field sensors. Therefore, magnetic stacks with decreased switching current and increased thermal stability are desired.

BRIEF SUMMARY

The present disclosure relates to a magnetic stack, such as a spin torque memory cell, or magnetic tunnel junction cell, that includes a metal oxide material which is antiferromagnetic at low temperatures and non-magnetic at high temperatures. The metal oxide layer enables thermally assisted switching of the magnetization orientation, allowing reduced switching temperature of the magnetic stack.

In one particular embodiment, this disclosure provides a magnetic stack comprising a ferromagnetic free layer having a switchable magnetization orientation, a metal oxide layer proximate the free layer, the metal oxide being antiferromagnetic at a first temperature and non-magnetic at a second temperature, a ferromagnetic reference layer having a pinned magnetization orientation, and a non-magnetic spacer layer between the free layer and the reference layer.

In another particular embodiment, this disclosure provides a method of forming a magnetic stack, the method including forming a ferromagnetic pinned reference layer, a ferromagnetic free layer, and a non-magnetic spacer therebetween, and then forming a metal oxide layer on the free layer.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

This disclosure is directed to magnetic stacks (e.g., spin torque memory (STRAM) cells and magnetic read sensors) that include a metal oxide layer proximate the free layer that at low temperature is antiferromagnetic but at a high temperature is non-magnetic. By including such a metal oxide layer proximate the free layer in a magnetic stack, the thermal stability of the stack can be maintained, and a lower switching current is provided for memory cell embodiments. The metal oxide layer results in reduction of the effective spin torque barrier due to magnetic moment fluctuation and disorder, thermal assisted switching, and spin specular reflection. The metal oxide layer is easy to control and fabricate, forms a natural interface with the free layer, and the pinning strength of the metal oxide layer is easily tunable.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. Any definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Figure 1A:
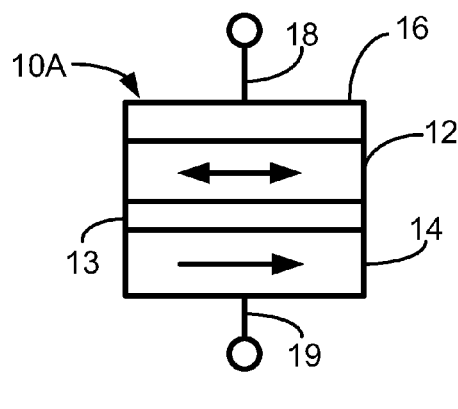
FIGS. 1A and 1B are cross-sectional schematic diagrams of magnetic stacks, in particular, memory cells.
Figure 1B:
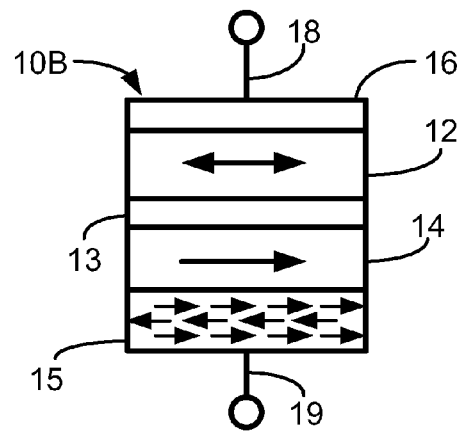

FIGS. 1A and 1B are cross-sectional schematic diagram of a magnetic stack 10A. In some embodiments, magnetic stack 10A is a magnetic read sensor such as a magnetic read sensor used in a rotating magnetic storage device. In other embodiments, magnetic stack 10A is a magnetic memory cell 10A and may be referred to as a magnetic tunnel junction cell (MTJ), variable resistive memory cell, variable resistance memory cell, or resistive sense memory (RSM) cell or the like. Magnetic cell 10A includes a ferromagnetic free layer 12 and a ferromagnetic reference (i.e., pinned) layer 14, each having a magnetization orientation. Ferromagnetic free layer 12 and ferromagnetic reference layer 14 are separated by a non-magnetic spacer layer 13. Note that other layers, such as seed or capping layers, are not depicted for clarity but could be included as technical need arises.

Ferromagnetic layers 12, 14 may be made of any useful ferromagnetic (FM) material such as, for example, Fe, Co or Ni and alloys thereof, such as NiFe and CoFe, and ternary alloys, such as CoFeB. Either or both of free layer 12 and reference layer 14 may be either a single layer or a synthetic antiferromagnetic (SAF) coupled structure, i.e., two ferromagnetic sublayers separated by a metallic spacer, such as Ru or Cr, with the magnetization orientations of the sublayers in opposite directions to provide a net magnetization. Free layer 12 may be a synthetic ferromagnetic coupled structure, i.e., two ferromagnetic sublayers separated by a metallic spacer, such as Ru or Ta, with the magnetization orientations of the sublayers in parallel directions. In some embodiments, ferromagnetic layers 12, 14, particularly free layer 12, is formed of a ferromagnetic material with acceptable anisotropy and a saturation moment (Ms) that is at least 500 emu/cc, in some embodiments at least 1100 emu/cc, and in yet other embodiments at least 1500 emu/cc, where emu refers to electromagnetic unit of magnetic dipole moment and cc refers to cubic centimeter.

Either or both layers 12, 14 are often about 0.1-10 nm thick, depending on the material and the desired resistance and switchability of free layer 12. In some embodiments, free layer 12 is thinner than reference layer 14. As will be described below, free layer 12 of the magnetic stacks of this disclosure can be thinner than free layers of other magnetic stacks.

Non-magnetic spacer layer 13 is an insulating barrier layer sufficiently thin to allow tunneling of charge carriers between reference layer 14 and free layer 12. Examples of suitable electrically insulating material include oxides material (e.g., $Al_2O_3$, $TiO_x$ or MgO). Non-magnetic spacer layer 13 could optionally be patterned with free layer 12 or with reference layer 14, depending on process feasibility and device reliability.

In the embodiment illustrated in FIG. 1B, proximate ferromagnetic reference layer 14 is an antiferromagnetic (AFM) pinning layer 15, which pins the magnetization orientation of ferromagnetic reference layer 14 by exchange bias with the antiferromagnetically ordered material of pinning layer 15. Examples of suitable pinning materials include PtMn, IrMn, and others. In alternate embodiments, other mechanisms or elements may be used to pin the magnetization orientation of reference layer 14. Note that other layers, such as seed or capping layers, are not depicted for clarity.

In accordance with this disclosure, magnetic stack or cell 10A includes a metal oxide layer 16 proximate ferromagnetic free layer 12. Metal oxide layer 16 is positioned so that free layer 12 is between spacer layer 13 and metal oxide layer 16. In some embodiments, there is no intervening layer between metal oxide layer 16 and free layer 12.

Figure 2A:
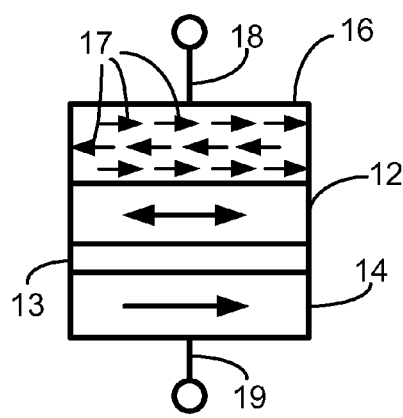
FIGS. 2A and 2B are cross-sectional schematic diagrams of the magnetic stack in a first state (FIG. 2A) and in a second state (FIG. 2B)
Figure 2B:
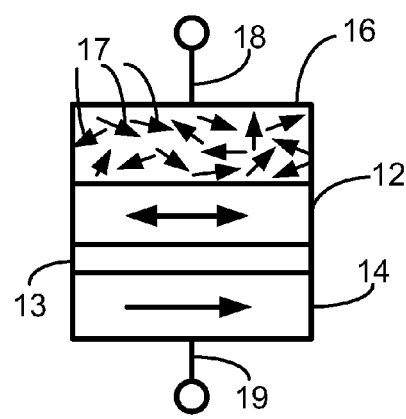

Metal oxide layer 16 is antiferromagnetic at a first (i.e., low) temperature and is non-magnetic at a second (i.e., high) temperature. In other words, metal oxide layer 16 has a variable magnetization, depending on its temperature. When metal oxide layer 16 is in its antiferromagnetic state (see FIG. 2A), magnetic moments 17 of adjacent atoms of layer 16 are ordered and point in opposite directions. When metal oxide layer 16 is in its non-magnetic state (see FIG. 2B), magnetic moments 17 are disordered and randomly fluctuate. At room temperature, metal oxide layer 16 is antiferromagnetic, but changes to non-magnetic at temperatures greater than room temperature, for example, several tens of degrees to a hundred degrees higher. In some embodiments, metal oxide layer 16 is antiferromagnetic at temperatures less than 200° C. and is non-magnetic at temperatures greater than 200° C. In other embodiments, metal oxide layer 16 is antiferromagnetic at temperatures less than 150° C. and is non-magnetic at temperatures greater than 150° C. In still other embodiments, metal oxide layer 16 is antiferromagnetic at temperatures less than 100° C. and is non-magnetic at temperatures greater than 100° C.

Examples of suitable materials for metal oxide layer 16 include Co and Co alloy oxides (e.g., $CoO_x$), Fe and Fe alloy oxides (e.g., $FeO_x$, $FeMnO_x$), and Ni and Ni alloy oxides (e.g., $NiO_x$). Other metals or alloy oxides may additionally have the required properties, of being ferromagnetic at low temperature and non-magnetic at high temperature. Metal oxide layer 16 may be formed of one or more materials, which either individually or together provide the required properties. If metal oxide layer 16 is formed of multiple materials, these materials may be present as domains of one material present in a matrix of another material, or may be stacked layers of materials. For example, metal oxide layer 16 may be a multilayered structure, such as a laminated multilayer structure. The material of metal oxide layer 16 is, in most embodiments, homogenous across its width and length.

Metal oxide layer 16 is often about 5-30 Angstroms thick (e.g., about 10-20 Angstroms), depending on the material of metal oxide layer 16 and the adjacent free layer 12. In some embodiments, metal oxide layer 16 may be a non-continuous and/or non-contiguous layer.

To provide current to cell 10A, 10B, a first electrode 18 is in electrical contact with ferromagnetic free layer 12 and a second electrode 19 is in electrical contact with ferromagnetic reference layer 14 via optional pinning layer 15. Electrodes 18, 19 electrically connect ferromagnetic layers 12, 14 to a control circuit providing read and write currents through layers 12, 14.

The resistance across magnetic cell 10A, 10B, and thus data state, is determined by the relative orientation of the magnetization vectors or orientations of ferromagnetic layers 12, 14. The magnetization direction of ferromagnetic reference layer 14 is pinned in a predetermined direction while the magnetization direction of ferromagnetic free layer 12 is free to rotate under the influence of spin torque, which may be the result of current passing through cell 10A, 10B or orthogonal to cell 10A, 10B. During the reading process, which may be with a current of about 10 μA and at a temperature less than about 90° C. (e.g., about 80° C.), metal oxide layer 16 is antiferromagnetic whereas during the writing process, which is at a much higher temperature (e.g., in some embodiments about 100-200° C.), metal oxide layer 16 is non-magnetic.

In both FIGS. 1A and 1B, the magnetization orientation of free layer 12 is illustrated as undefined. In some embodiments, the magnetization orientation of free layer 12 will generally be either parallel to the magnetization orientation of reference layer 14 (i.e., the low resistance state) or anti-parallel to the magnetization orientation of reference layer 14 (i.e., the high resistance state). In some embodiments, the low resistance state may be the "0" data state and the high resistance state the "1" data state, whereas in other embodiments, the low resistance state may be "1" and the high resistance state "0".

Switching the resistance state and hence the data state of magnetic cell 10A, 10B via spin-transfer occurs when a current, under the influence of a magnetic layer of magnetic cell 10A, 10B, becomes spin polarized and imparts a spin torque on free layer 12. When a sufficient level of polarized current and therefore spin torque is applied to free layer 12, the magnetization orientation of free layer 12 can be changed among different directions and accordingly, the magnetic cell can be switched between the parallel state, the anti-parallel state, and other states. In other embodiments of magnetic stacks, the magnetization orientation of free layer 12 is influenced by a neighboring magnetic field, such as located on magnetic recording medium. When a sufficient magnetic field is applied to free layer 12, the magnetization orientation of free layer 12 can be changed among different directions, between the parallel state, the anti-parallel state, and other states.

The properties of metal oxide layer 16, being antiferromagnetic at low temperatures and non-magnetic at high temperatures, allow the use of lower switching current (e.g., no more than about 100-500 μA (about 0.1-0.5 mA)) while maintaining thermal stability of the magnetization orientations, than if no metal oxide layer was present. In some embodiments, the switching current is no more than 400 μA, in other embodiments no more than about 200 μA. When no switching current is present, metal oxide layer 16 is at a low temperature and is antiferromagnetic. The adjacent free layer 12 is stabilized by the antiferromagnetic metal oxide layer 16 due to the exchange coupling at the interface of free layer 12 and metal oxide layer 16. Because metal oxide layer 16 provides a pinning effect on free layer 12 (which increases thermal stability of free layer), a thinner free layer 12 has the same level of stability as a thicker free layer with no adjacent metal oxide layer. In some embodiments, the total thickness of free layer 12 and metal oxide layer 16 has the same level of stability as a thicker free layer with no adjacent metal oxide layer. Because the blocking temperature of the metal oxide is low (e.g., about 100° C., or about 150° C.), there is no issue regarding temperature variation from one cell 10A, 10B to an adjacent cell when applying a switching current to cell 10A, 10B or to the adjacent cell. The antiferromagnetic material confines thermal dissipation to the cell being written and thus reduces the necessary switching current.

When switching current is present for cell 10A, 10B, metal oxide layer 16 is at a high temperature and is non-magnetic. The non-magnetic metal oxide layer 16 is less stabilizing to free layer 12 than the antiferromagnetic metal oxide layer 16, thus allowing free layer 12 to readily switch. Additionally, the non-magnetic property provides a spin specular (e.g., reflective) effect within free layer 12, thus reducing the needed switching current for that cell 10A, 10B. A non-continuous or non-contiguous metal oxide layer 16 may further reduce the switching current by focusing the current and increasing the current density through free layer 12.

The magnetic stacks of this disclosure, including any or all of layers 12, 13, 14, 16, may be made by thin film techniques such as chemical vapor deposition (CVD), physical vapor deposition (PVD), and atomic layer deposition (ALD). Metal oxide layer 16 may be formed on free layer 12 by oxidizing a portion of free layer 12 or by applying as a separate layer. For example, The selection of the materials for metal oxide layer 16 formed from oxidized free layer 12 depends on the magnetic transport property of free layer 12 (e.g., the magnetic resistance (MR) ratio of free layer 12 and its oxide) and the blocking temperature of oxide layer 16. For example, CoFeB and NiFeB are preferred free layer materials and their oxides, CoO and NiO, respectively, have good tenability and reasonable blocking temperatures. CoFe, which has a lower MR, is also acceptable.

Figure 3:
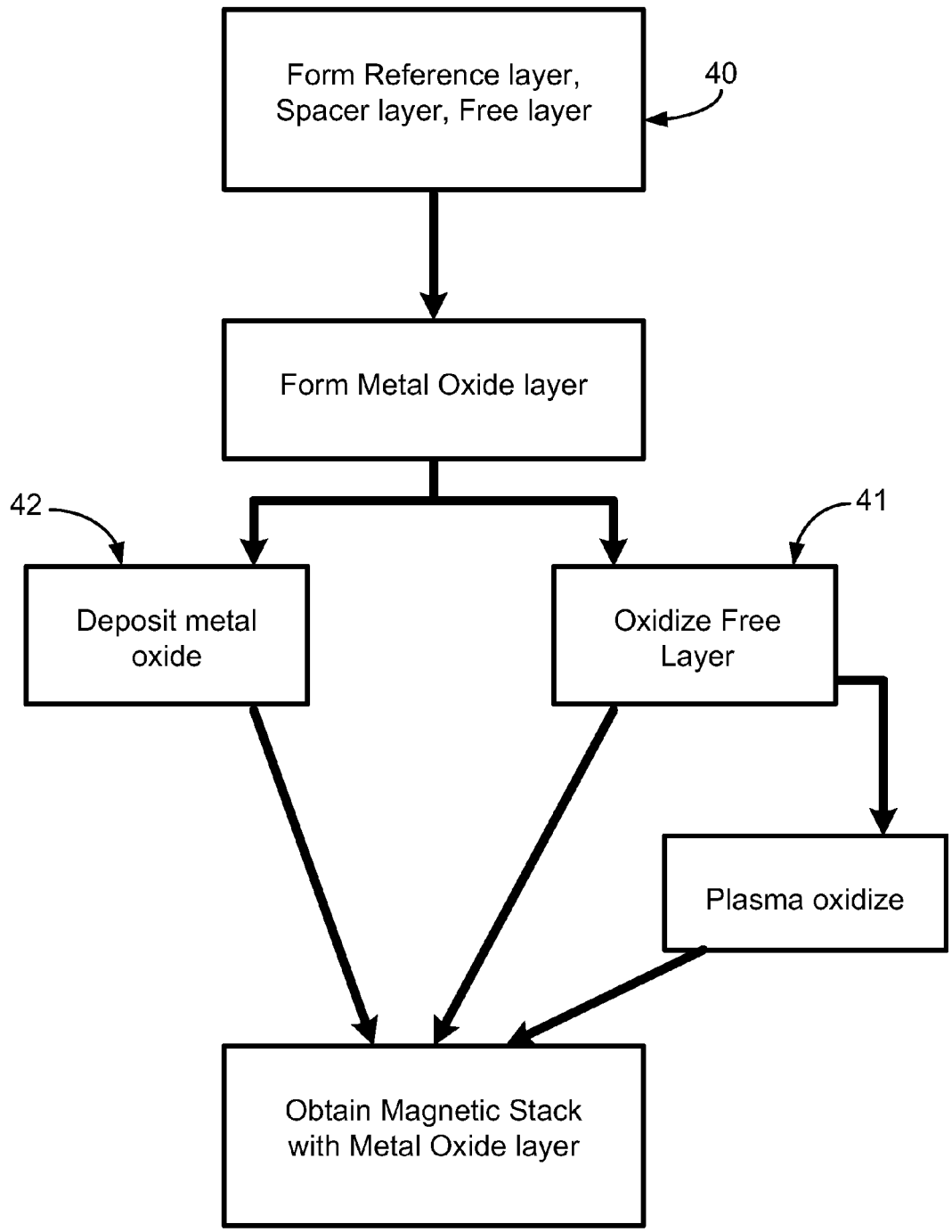
FIG. 3 is a process flow diagram for a method of making a magnetic stack.

FIG. 3 illustrates two methods for forming a magnetic stack having a metal oxide layer. In both methods, the magnetic stack (i.e., including reference layer 14, spacer 13 and free layer 12) is formed (Step 30).

The first method for forming metal oxide layer 16 includes oxidizing metal oxide layer 16 (Step 31) by exposing free layer 12 to an oxygen-rich environment. The thickness of the resulting thin layer of oxide depends on various processing factors such as the level of oxygen, the temperature, and the duration of exposure. In some embodiments, free layer 12 may be heated to facilitate oxidation. In some methods, the oxidation of free layer 12 to form metal oxide layer 16 is via plasma oxidation (i.e., using $O_2$ plasma). The thickness and quality of the resulting thin layer of oxide depends on factors such as $O_2$ pressure, temperature, and plasma power.

The second method of forming metal oxide layer 16 is to directly form (e.g., deposit) onto free layer 12 (Step 32). The antiferromagnetic oxide selected may be different than the ferromagnetic material, allowing for device optimization. For example, a metal oxide layer 16 of NiO may be deposited onto a free layer 12 formed of CoFeB. The deposition of layer 16 may be done, for example, by reactive sputtering.

Figure 4:
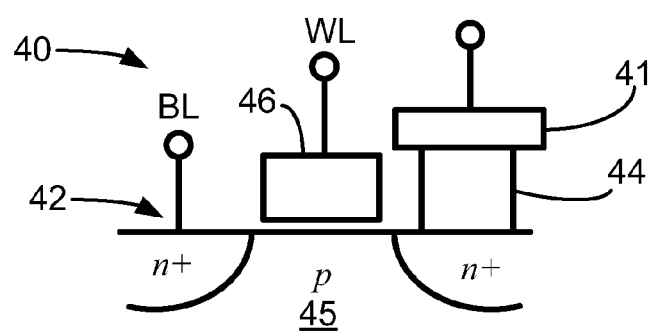
FIG. 4 is a schematic diagram of an illustrative memory unit including a memory cell and a semiconductor transistor.

FIG. 4 is a schematic diagram of an illustrative memory unit 40 including a memory element 41 electrically coupled to a semiconductor transistor 42 via an electrically conducting element 44. Memory element 41 may be any of the memory cells described herein. Transistor 42 includes a semiconductor substrate 45 having doped regions (e.g., illustrated as n-doped regions) and a channel region (e.g., illustrated as a p-doped channel region) between the doped regions. Transistor 42 includes a gate 46 that is electrically coupled to a word line WL to allow selection and current to flow from a bit line BL to memory element 41. An array of memory units 40 can be formed on a semiconductor substrate utilizing semiconductor fabrication techniques.

Figure 5:
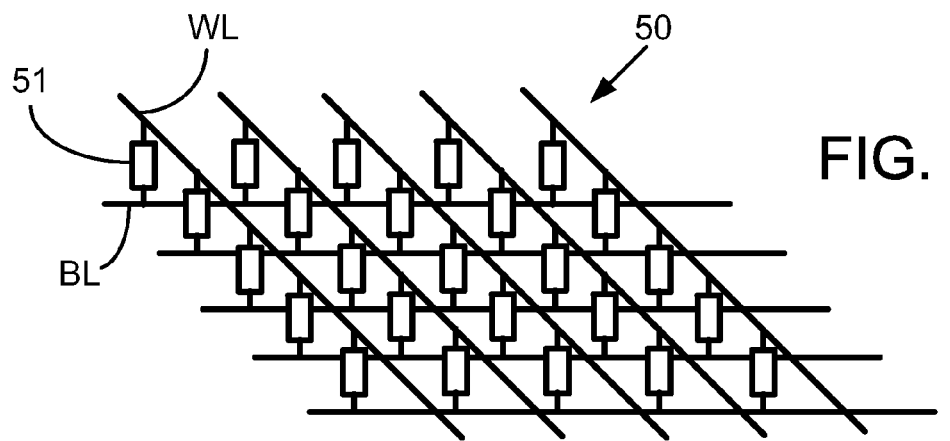
FIG. 5 is a schematic diagram of an illustrative memory array.

FIG. 5 is a schematic diagram of an illustrative memory array 50. Memory array 50 includes a plurality of word lines WL and a plurality of bit lines BL forming a cross-point array. At each cross-point a memory element 51 is electrically coupled to word line WL and bit line BL. Memory element 51 may be any of the memory cells described herein.

Thus, embodiments of the MAGNETIC STACK WITH OXIDE TO REDUCE SWITCHING CURRENT are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:
1. A magnetic stack comprising:
a ferromagnetic free layer having a switchable magnetization orientation;
a metal oxide layer proximate the free layer, the metal oxide layer being antiferromagnetic at a first tempera- ture and being non-magnetic at a second temperature, the second temperature being greater than the first temperature;

a ferromagnetic reference layer having a pinned magnetization orientation; and a non-magnetic spacer layer between the free layer and the reference layer, wherein there is no intervening layer between the ferromagnetic free layer and the metal oxide layer.

2. The magnetic stack of claim 1 wherein the free layer is between the metal oxide layer and the spacer layer.

3. The magnetic stack of claim 1 wherein the metal oxide layer comprises an oxide of Co or its alloys, Ni or its alloys, or Fe or its alloys.

4. The magnetic stack of claim 1 wherein the free layer comprises CoFeB, NiFeB, or CoFe.

5. The magnetic stack of claim 1 wherein the metal oxide layer has a thickness of about 5-30 Angstroms.

6. The magnetic stack of claim 1 wherein at the first temperature, the metal oxide layer comprises ordered magnetic moments in opposite directions, and wherein at the second temperature, the metal oxide layer comprises disordered magnetic moments.

7. The magnetic stack of claim 1 wherein the first temperature is less than 200° C. and the second temperature is greater than 200° C.

8. The magnetic stack of claim 1 wherein the magnetic stack is a magnetic tunnel junction memory cell.

9. The magnetic stack of claim 1 wherein the magnetic stack is a magnetic read sensor in a recording head.

10. A magnetic tunnel junction comprising:

a ferromagnetic free layer having a switchable magnetization orientation;

a metal oxide layer proximate the free layer;

a ferromagnetic reference layer having a pinned magnetization orientation; and a non-magnetic spacer layer between the free layer and the reference layer;

wherein the metal oxide layer is antiferromagnetic during a reading process of the magnetic tunnel junction and non-magnetic during a writing process of the magnetic tunnel junction, and wherein there is no intervening layer between the ferromagnetic free layer and the metal oxide layer.

11. The magnetic tunnel junction of claim 10 wherein the metal oxide layer comprises a material that is antiferromagnetic at a low temperature and is non-magnetic at a higher temperature.

12. The magnetic tunnel junction of claim 10 wherein the metal oxide layer comprises an oxide of Co or its alloys, Ni or its alloys, or Fe or its alloys.

13. The magnetic tunnel junction of claim 12 wherein the metal oxide layer has a thickness of about 5-30 Angstroms.

14. The magnetic tunnel junction of claim 10 wherein a temperature during the reading process is less than 200° C. and a temperature during the writing process is greater than 200° C.

15. The magnetic tunnel junction of claim 10 wherein the metal oxide layer is non-contiguous with the free layer.

16. A method of forming a magnetic stack, the method comprising:

forming a ferromagnetic pinned reference layer, a ferromagnetic free layer, and a non-magnetic spacer therebetween; and forming a metal oxide layer on the free layer, the metal oxide layer being antiferromagnetic at a first temperature and non-magnetic at a second temperature, the second temperature being greater than the first temperature, wherein there is no intervening layer between the ferromagnetic free layer and the metal oxide layer.

17. The method of claim 16 wherein forming a metal oxide layer comprises oxidizing a portion of the free layer.

18. The method of claim 17 wherein oxidizing comprises oxidizing in an oxygen rich environment and further comprising heating the free layer.

19. The method of claim 17 wherein oxidizing comprises oxidizing with $O_2$ plasma.

20. The method of claim 16 wherein forming a metal oxide layer comprises depositing via reactive sputtering the metal oxide layer on the free layer.

* * * * *